United States Patent [19]

Cole

[11] Patent Number: 4,519,046
[45] Date of Patent: May 21, 1985

[54] SIGNAL PROCESSING APPARATUS AND METHOD

[76] Inventor: Trevor W. Cole, 28 Gordon Crescent, Stanmore, New South Wales 2048, Australia

[21] Appl. No.: 293,225
[22] PCT Filed: Dec. 16, 1980
[86] PCT No.: PCT/AU80/00109
 § 371 Date: Aug. 7, 1981
 § 102(e) Date: Aug. 7, 1981
[87] PCT Pub. No.: WO81/01927
 PCT Pub. Date: Jul. 9, 1981

[30] Foreign Application Priority Data

Dec. 19, 1979 [AU] Australia ............................ PE1784

[51] Int. Cl.³ .................... G06G 9/00; H03K 19/14
[52] U.S. Cl. .................................... 364/822; 364/824
[58] Field of Search ............. 364/822, 824, 826, 827, 364/713; 455/601, 617; 307/311, 312

[56] References Cited

U.S. PATENT DOCUMENTS

| | | | |
|---|---|---|---|
| 3,108,189 | 10/1963 | Bowerman, Jr. | 307/311 |
| 3,290,504 | 12/1966 | Vallese et al. | 455/617 |
| 3,488,586 | 1/1970 | Watrous et al. | 455/601 |
| 3,599,209 | 8/1971 | Goodrich | 364/822 X |
| 3,638,006 | 1/1972 | Hogan | 364/822 |
| 3,732,565 | 2/1973 | Symaniec et al. | 364/822 X |
| 3,872,293 | 3/1975 | Green | 364/827 |
| 3,875,534 | 4/1975 | Haven | 455/601 X |
| 4,204,262 | 5/1980 | Fitelson et al. | 364/826 X |
| 4,209,806 | 6/1980 | Koike et al. | 358/212 |
| 4,365,164 | 12/1982 | Sibley | 307/311 X |

FOREIGN PATENT DOCUMENTS

| | | |
|---|---|---|
| 61503 | 7/1965 | Australia . |
| 38215 | 1/1972 | Australia . |
| 38216 | 1/1972 | Australia . |
| 2733699 | 2/1978 | Fed. Rep. of Germany ...... 358/212 |
| 1504530 | 12/1967 | France . |
| 2064659 | 7/1971 | France . |
| 2098717 | 10/1972 | France . |

OTHER PUBLICATIONS

Schaefer et al.: Tse Computers, Proceedings of the IEEE, vol. 65, No. 1, Jan. 1978, pp. 129–138.
Jackson et al.: A New Approach to Utilization of Opto-Electronic Technology, COMPCON-Paper Feb. 1974.
Backman et al.: Signal Correlator, IBM Technical Disclosure Bulletin, vol. 4, No. 3, Aug. 61, p. 92.

Primary Examiner—Felix D. Gruber
Attorney, Agent, or Firm—Sughrue, Mion, Zinn, Macpeak, and Seas

[57] ABSTRACT

Signal processing, particularly correlation and autocorrelation, is effected using a "light panel". The light panel consists of (a) an array of two-terminal light-emitting or light-modulating elements (10), the optical state of each element being changed from a first state to a second state when a voltage difference is applied across its terminals, and (b) a complementary array of photodiodes (12), each arranged to receive light from a respective element of the array of light-emitting or light-modulation elements (10). The interconnection between the two arrays may be simply an optical lens (11). For auto-correlation, each array may be a linear array, with the signal from a single signal source applied to the terminals of each element (10) both instantaneously and after a predetermined time delay. For cross-correlation, each element (10) will be located at a cross-over point of an m x n matrix of conductors (insulated from each other) with its terminals connected to respective conductors at the cross-over point. When the light panel is used for correlation, the photodiodes act as charge integrators. Uses of the apparatus and method include image processing, image analysis and speckle interferometry.

18 Claims, 5 Drawing Figures

SIGNAL PROCESSING APPARATUS AND METHOD

TECHNICAL FIELD

This invention concerns signal processors. In a particular application, it concerns correlators and auto-correlators which use an array of light emitting or light modulating elements operating as "EXCLUSIVE OR" or "NEGATED-EXCLUSIVE-OR" logic elements, the optical output from such an array being processed to provide correlation information.

BACKGROUND ART

The technique of one-bit digital processing is a well-accepted tool of science. For example, its implementation in radio astronomy spectroscopy was described by B. F. C. Cooper in his paper entitled "Autocorrelation Spectrometers", which was published in "Methods of Experimental Physics", Volume 12, Part B, Edited by M. L. Meeks (Academic Press, 1976), pages 289–298. Various forms of correlator have been produced for such correlation. These have up to several thousand channels and clock rates up to several tens of megahertz. Larger and faster correlators are not produced, however, for with prior art components and arrangements, the larger correlators are found to possess inherent disadvantages in timing accuracy, bulk size and power dissipation.

SUMMARY OF THE INVENTION

One object of the present invention is the provision of means whereby one-bit correlators which may be constructed so that they are large, fast, and without severe heat dissipation problems. Another objective is the provision of one-bit correlators which are simple to construct, and which can be made large in terms of number of channels, yet compact and with low power dissipation.

These objectives are achieved by the construction of correlators using what has been termed by the present inventor a "light panel". The light panel is an array of light emitting or light modulating elements arranged in matrix form, operating as "EXCLUSIVE OR" ("XOR") or "NEGATED-EXCLUSIVE-OR" ("NEXOR") logic elements. The optical output from the elements of the light panel are processed by optical means, such as a complementary array of photodiodes.

According to the present invention, there is provided a correlator which comprises, in combination:

(a) an array of light emitting or light modulating elements, each element being a device which changes from a first optical state to a second optical state when a voltage is applied across it, each element being adapted to receive two voltage signals, the optical state of each element at any instant being dependent on the relative values of the voltage signals; and (b) a complementary array of photodiodes, each photodiode being adapted to receive light from a respective one of said light emitting or light modulating elements.

If the array is a linear array, the correlator may be used as an autocorrelator, as will be shown below. For purposes other than autocorrelation of a signal, the array will usually be in the form of a two-dimensional array. Each light emitting or light modulating element may conveniently be a light emitting diode device and series resistor combination, a neon-discharge or other plasma-discharge lamp (preferably with a series current-limiting capacitor or resistor), a liquid crystal, a deuterated potassium di-hydrogen phosphate (DKDP) or other Pockel's effect device, a vacuum fluorescent device, an electroluminescent device, or any other suitable device having the appropriate properties.

If, as indicated above, the array of light emitting or light modulating elements is a one-dimensional array (usually a linear array), and one of the signals applied to the elements is common and the other signals are the outputs of shift registers or delay lines to which the common signal source has also been connected, an auto-correlator is formed.

As also noted above, the present invention will provide larger one-bit correlators. In this case, the light emitting or light modulating elements of the array will be located at the cross-over points of a matrix formed by a plurality of linear electrical conductors, each conductor being insulated from each other conductor, the elements being connected across the conductors at the respective cross-over points.

The electrical conductors of such a light panel need not be formed as a rectangular matrix (though in practice this will often be the case), but can be formed in any required configuration. For example, for a particular correlation, it may be convenient to form the matrix in a configuration which is representative of a polar diagram, or the spatial frequency plane of a circular array of receiving aerials (such as the solar radioheliograph described by N. R. Labrum, D. J. McLean and J. P. Wild in "Methods of Computational Physics" Volume 14, page 1, 1975).

A feature which will commonly be present in correlators constructed in accordance with the present invention, is means to focus the emitted or modulated light signals from the elements of the array on to respective photodiodes in the complementary array of photodiodes.

The correlation method of the present invention may also be extended to observing the optical state of each element of the array of light-emitting or light-modulating elements by focusing the light emitted or modulated by the elements of the array on to a complementary array of photodiodes.

The outputs from the photodiodes may be displayed or processed in any convenient manner.

Embodiments of the present invention will now be described, by way of example, with reference to the accompanying drawings.

MODES OF CARRYING OUT THE INVENTION

It is well-known that a light emitting diode device (LED) emits light when a potential difference of the correct polarity is applied across it. Other devices exhibit a similar property. It has not previously been appreciated that if binary digital signals of logic state 1 and 0 are applied to the LED, the LED will flash whenever the logic states on the two sides are different and of the correct polarity. Thus the LED performs a logical EXCLUSIVE-OR (XOR) operation on the two signals. Due to the unidirectional properties of a LED, the true XOR signal is obtained when each pair of signals is applied twice to the LED during the time for which the signals are sampled, the second time with the signal polarity reversed. If (a) a series resistor is used to limit the current through the LED and (b) the binary digital signals are arranged to be either a constant voltage or zero (corresponding to logic states 1 and 0) and are applied for a constant sample time, then the mean light level from the LED is an accurate measure of the number of times the logic states of the two signals are anti-coincident. The present invention utilises this property of LEDS (and other devices), as will be seen.

Figure 1:
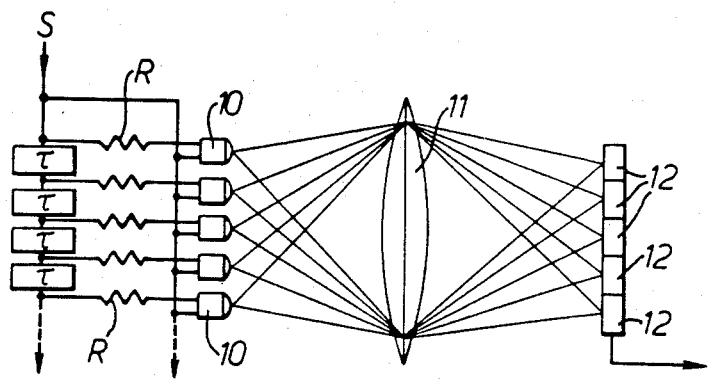
FIG. 1 is a diagram of a linear array of light-emitting diodes (a "light panel") imaged on to a linear array of photodiodes, and connected for autocorrelation of a one-bit quantized signal.

Referring now to FIG. 1, a linear array of light emitting diodes 10 is located so that the light output of each diode is focused by lens 11 on to a corresponding photodiode in a complementary linear array of photodiodes 12. One terminal of each LED 10 is connected to an incoming quantized signal S. The other terminals of the LEDs 10 are connected through respective limiting resistors R to the signal S after it has been delayed by a time which is a multiple of "$\tau$". If "$\tau$" is the time separation of the successive samples of an electrical signal which produce the quantized signal S, each LED 10 compares the signal S with the signal S that existed an integral number of sample periods previously. Each LED thus performs an autocorrelation function, and flashes if there is anti-correlation at the respective delay period (and if the polarity is correct to cause it to flash). To indicate correlation (that is, the logical NEXOR function), all that is necessary is for the logical inverse of the signal S to be applied to the common LED terminals.

As already noted, the light flashes from each LED 10 are focused by lens 11 on to respective photodiodes 12. Typical commercially available photodiodes saturate at about $10^7$ photoelectrons per diode. The photodiode integrates received photoelectrons until saturation is reached. Choosing the operating conditions to be such that the photodiodes 12 generate about 10 electrons each time the LED 10 flashes for the duration of one sample interval, any photodiode 12 in the array can receive photoelectrons from about $10^6$ flashes before it saturates. Thus the photodiode array read-out is required at every $10^6$ sample periods or sooner.

Those skilled in this art will recognise that each LED and photodiode combination is equivalent to one NEXOR circuit plus 20 stages of binary counter ($10^6$ is approximately $2^{20}$). Such skilled persons will also be aware that read-out of photodiode arrays which have been constructed for solid state TV displays can be effected at rates of less than 1 microsecond per photodiode. Thus a 10,000 element photodiode array, requiring 10 milliseconds to read out, can be used with an equivalent array of LEDs receiving digital one-bit binary signals, provided that the frequency of the binary digital signals does not exceed about 100 MHz.

Figure 2:
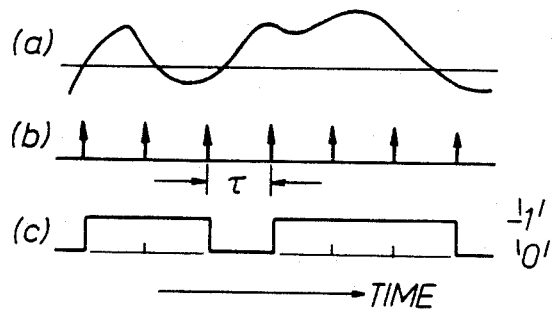
FIG. 2 illustrates the steps usually adopted in one-bit quantization of an analogue signal.

A typical derivation of the quantized signal S is illustrated in FIG. 2. In FIG. 2, an analogue electrical signal is shown at (a). It is sampled at the instants shown in (b), separated by a uniform clock period. The output (quantized) signal shown at (c) is a positive value (typically +5 volts for an LED array) when the analogue signal is positive, and is zero when the analogue signal is zero or negative at the moment of sampling. Thus the signal S is a string of equal duration samples of 0 or +5 volts (assuming the light panel comprises an LED array).

Figure 3:
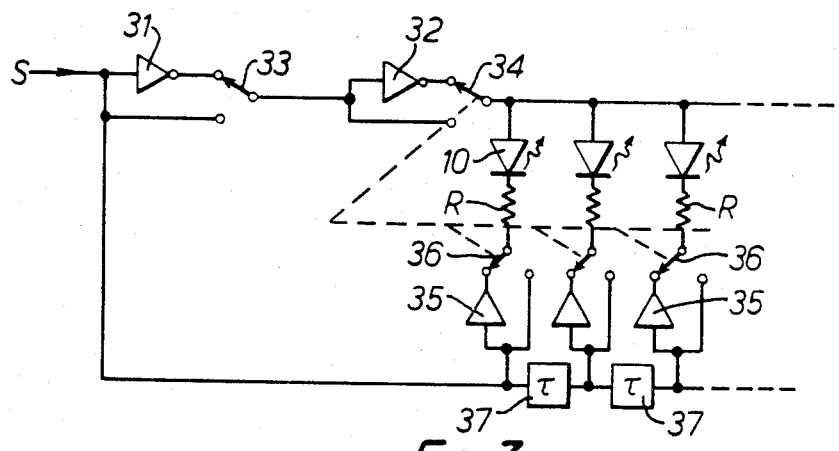
FIG. 3 is a diagram of a light panel construction for a complete one-bit autocorrelator with facilities for indication of true "XOR" logic signals and the correlation or the anti-correlation function.

A light panel for a complete autocorrelation system is shown in FIG. 3. This arrangement overcomes the polarity limitation and enables both correlation and anti-correlation to be measured. A logic inverting gate 31 is connected into the common signal supply to the LEDs 10 to enable the inverse of the binary signal S to be applied to the LEDs 10. Switch 33 permits either correlation or anti-correlation to be displayed by the flash of an LED 10. Switch 33 also permits any inherent offset in the correlator, and any drift in the photodiode array, to be compensated, if the switch is operated so that correlation or anti-correlation is indicated for the other half of the period of measurement. Those skilled in this art will be well aware that for the normalised one-bit situation, anti-correlation is simply 1-(correlation), so that equal time spent measuring both allows their difference to be formed. It is, of course, assumed that the signal being analysed remains the same throughout the period of measurement.

Polarity reversal of the signals applied to the LEDs 10 in the arrangement of FIG. 3 is achieved by the combination of logic inverting gates 32 and 35 with their respective associated switches 34 and 36. Switches 34 and 36 are synchronised, and each either (a) operate at twice the sample frequency to provide a polarity reversal after half the sample period, or (b) operate at the clock rate but with a quarter cycle phase adjustment.

It will be clear that with an associated photodiode array, linked as shown in FIG. 1, a light panel constructed as shown in FIG. 3 can produce an autocorrelator in which (a) true XOR functions for either correlation or anti-correlation can be obtained, by setting switch 33 to one position and operating switches 34 and 36 to effect polarity reversals half-way through each sample period, and (b) drift and offest effects in the photodiode array can be compensated by choosing one setting for switch 33 and performing autocorrelation for half the total measurement time, then repeating the autocorrelation with the switch 33 in its other setting, and differencing the two measurements of autocorrelation.

Figure 4:
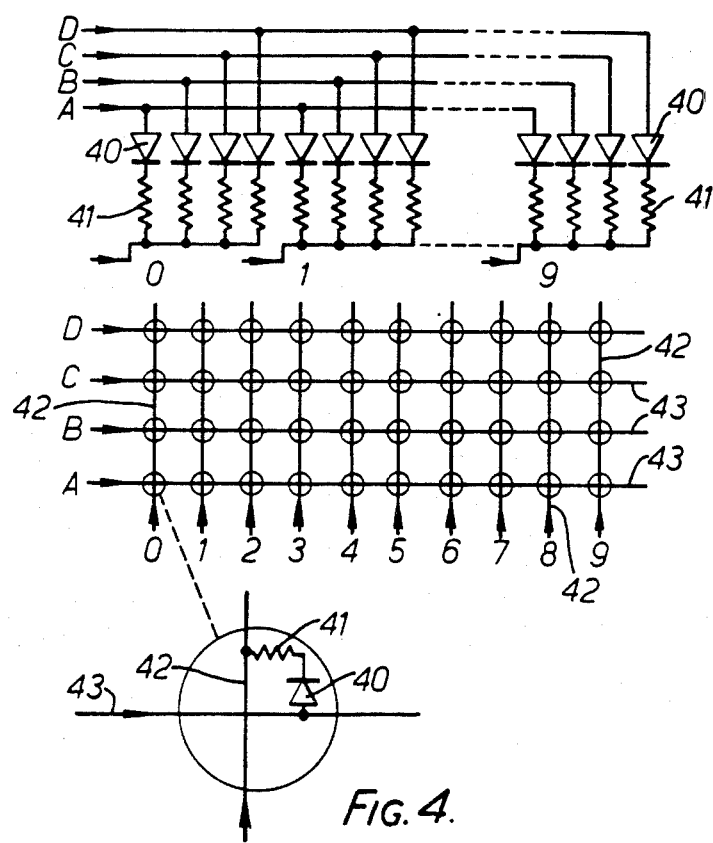
FIG. 4 illustrates the construction of a light panel for a one-bit cross-correlator in which four input signals are compared with each of ten other input signals.

The light panel illustrated in FIG. 4 is designed for use in a one-bit cross-correlator in which the binary quantized signals from four sources are compared with the binary quantized signals from ten other sources. One example of the sort of situation in which this form of cross-correlation would be used is in radio-astronomy, when the signals received by the aerials on one arm of a T-shaped array are compared with the signals received by the aerials in the other arm of the array.

The upper part of FIG. 4 illustrates the way in which signals from sources A, B, C and D are applied to one terminal of a 4×10 array of photodiodes 40, each with its associated series resistor 41, and signals from sources 0, 1, 2 . . . , 9 are applied to the other terminals of the array. The lower part of FIG. 4 illustrates one physical form of the array of photodiodes 40, and their connection to the respective signal sources through a matrix formed of linear electrical conductors 42, 43. This form of light panel, in association with a 4×10 array of photodiodes, linked by an optical connection as shown in FIG. 1, will provide a one-bit digital cross-correlator with the output from the photodiodes indicating the correlation or anti-correlation of the compared signals at each cross-over of the matrix of conductors 42, 43.

Figure 5:
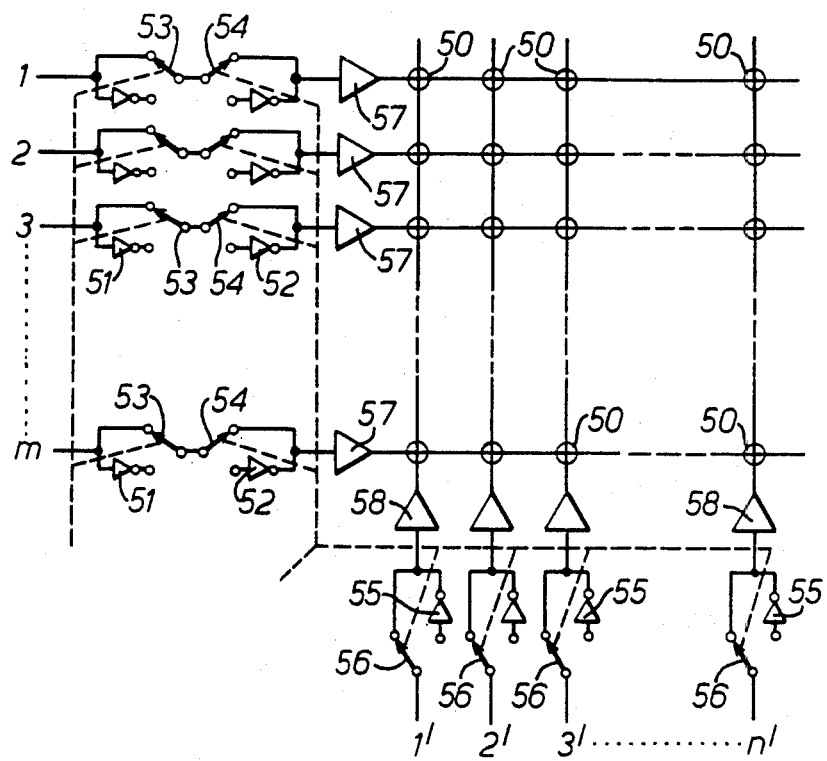
FIG. 5 is a diagram of a light panel for an m×n correlator, with choice of correlation or anti-correlation.

A light panel for an m×n cross-correlator is illustrated in FIG. 5. From the description above of the embodiment of FIG. 3, it will be clear that a cross-correlator incorporating the panel of FIG. 5 will (a) be able to provide an indication of either correlation or anti-correlation by selection of the settings of the m linked switches 53, to enable offset and drift in the photodiode array to be compensated; and (b) provide true XOR function outputs if linked switches 54 and 56 are operated at twice the sample frequency of the signals being analyzed, or at the sample frequency but with a quarter cycle phase difference.

References 51, 52 and 55 are to logic inverting gates. Note that drivers 57 and 58 are required for each row and column in the matrix of conductors, which have a LED/resistor combination 50 connected across each cross-over point.

In each of these embodiments, the read-out from the photodiode array can be displayed or processed by any suitable means, or stored for future processing. It is expected that the output of the photodiode arrays of correlators constructed in accordance with the present invention, if the array contains a substantial number of elements, will be interfaced to a computer for analysis purposes.

To test the present invention, an array of 128 light emitting diodes was wired as an autocorrelator and imaged on to a 128-element photodiode array. Square waves of different frequencies were used as input signals. The arrangement performed as a 128 point autocorrelator.

In another test of the present invention, a 128 element, 16×8 matrix array of LEDs was wired as a cross-correlator in accordance with the arrangement illustrated in FIG. 5. This light panel was used to process the signals that would be obtained from a T-shaped array of receiving aerials forming a radio telescope, with 16 aerials in the long arm and 8 aerials in the short arm. The outputs of the LEDs were imaged on to a photographic film for the periods of measurement. The film, when developed, showed clearly the integrated signal from each LED in the light panel, and faithfully reproduced the spatial frequency fringe pattern received by the array of aerials.

A 64×64 matrix array of LEDs has also been constructed in accordance with the arrangement of FIG. 5. This has functioned effectively as a 64×64 (=4096) channel correlator.

Earlier in this specification, reference was made to alternatives to the LED/resistor combination for the light panels. One of the alternatives mentioned was a neon discharge lamp. Panels incorporating neon lamps at the cross-overs of the matrix of conductors are easy to fabricate and have the advantage that the neon lamp flashes when the potential difference across its terminals is sufficient, irrespective of polarity. However, the required voltage difference is generally between 100 and 200 volts. Series current limiting resistors or charge limiting capacitors would be needed at each neon lamp location for fully parallel operation.

Another alternative to the LED array is a liquid crystal sheet with a lamp located behind it. With a sheet of liquid crystal material, electrodes can be inserted at appropriate locations and wired up as indicated for the LED light panels, and when there is a voltage difference between the two adjacent electrodes, the material between the electrodes changes from black to clear, so that light from the lamp is transmitted through the sheet at that location. The regions of liquid crystal material between each pair of electrodes thus becomes a light modulating element. The light flash obtained when a region of liquid crystal material becomes transparent can be focused on to a photodiode as in the case of the LED array light panel to form a correlator. There is no requirement for a series resistor with this alternative, for the liquid crystal material is voltage sensitive.

A variation of the liquid crystal alternative is the use of single crystals of a material which exhibits the longitudinal Pockels effect. One example of this is single crystal DKDP (deuterated potassium di-hydrogen phosphate). Again the panel element will be opaque or transparent at the cross-over locations, according to the voltage states at the ends of the crystal. Again, no series resistor is required.

Some variations in the use of correlators incorporating the light panel will now be described.

Quantization of an analogue signal for one-bit correlation necessarily introduces a distortion to the correlation function (which can subsequently be corrected) and a sensitivity loss. The sensitivity loss can be recovered, at least in part, by correlating samples which have two-, three- or many-bit representation, by applying to the one-bit quantized signal a modulation which limits the time it is applied to a fraction of the sample time which is proportional to the analogue signal levels. That is, the quantized one-bit signal is pulse width modulated. In fact, an analogue signal can be correlated without loss of sensitivity if pulse width modulation is used to impose the analogue modulation to the columns of a rectangular matrix array, and direct current or voltage modulation is applied to the rows. Those skilled in this art will recognise that further complexities of current modulation of rows and pulse width modulation of columns can be used to achieve analogue/analogue cross-correlation.

INDUSTRIAL APPLICABILITY

One large application of correlation in science is to correlate flashes of light represented by the logic state "1." This application differs from the above description in that the logical AND function is required. To illustrate an AND function in the light panels illustrated in FIGS. 1, 3, 4 and 5, an LED in the panel must flash whenever the logical state 1 appears on both of its inputs. This is easily obtained. Indeed, it results in a simplification of the panels illustrated in FIGS. 3 and 5, for the necessary modification is the removal of the polarity reversing gates and switches.

It is also possible to perform spatial autocorrelation of a black-and-white picture using the present invention with the light panels modified to display an AND logic event, as described in the last preceding paragraph. Spatial autocorrelation is often useful in image processing, image analysis, and speckle interferometry in astronomy. The autocorrelation of a picture measures the number of times bright picture points have the same separation and orientation. The result is a distribution of separations and orientations with the value at each point the number of times that one occurred in the given picture. The image to be processed is read out by a TV type of camera as a series of lines across the image. If the picture is black, the output is "0"; if the picture is white, the output is "1". A gap equal to one line time must be present between reading successive lines and a gap equal to one frame time must be present between reading successive frames. The light panel is then used to take the temporal autocorrelation of the one-bit signal. Bright picture points of a given separation and orientation always have the same gap in time on the signal and all separations and orientations have a unique gap or delay. The autocorrelation therefore contains all the information required. If the array of LEDs (or other elements) in the light panel of the correlator is made with each row containing as many elements as two line times (i.e. one line plus its gap), then the true two-dimensional distribution is displayed directly. The light panel, unlike other approaches to autocorrelation of a picture, can perform the calculation at video rates of many megahertz or full picture frames at 100 frames per second or more.

Another application of the correlators and the method of the present invention is to the direct spectral analysis of a temporal signal. The cosine spectrum of a signal V(t) which varies with time is given by the relationship:

$$1/T \int_0^T V(t) \cos (wt) dt$$

That is, it is the average of the product of the signal and a cosine of frequency w for different values of w. If a light which varies in intensity as cos wt is modulated (multiplied) by V(t), as a function of time, then the mean light output is one component of the spectrum. The light panel of the present invention offers a unique way of obtaining the complete spectrum simultaneously. The required information is obtained using a correlator having a light panel in which all the light emitting elements vary in output of photons as cos wt, but each light emitting element has its own unique value for w. Then V(t) modulates the light from the entire panel (by pulse width, or voltage, or current modulation approaches, or by overall shutter) and a complementary photodiode array measures the mean light level (plus a fixed light offset) of each element of the light panel. Precisely this arrangement is obtained if a light panel of a correlator constructed in accordance with the present invention is wired to perform autocorrelation of a time signal having a frequency which is sweeping linearly with time. Then at each delay, two frequencies are compared. They beat together at the light point to produce a cos (Δw)t variation. Note that Δw is proportional to delay for autocorrelation.

The main complication with such an arrangement is that for one-bit signals, a triangular rather than cosine variation of frequency w is obtained. One-bit times analogue or other approaches (see above) can be used to provide more exact spectra, or deconvolution can be used to convert the triangular derived spectrum.

Yet another example of the use of correlators constructed in accordance with the present invention is in the direct spatial frequency analysis of a two-dimensional picture. This further application is possible when autocorrelation is taken of the sweeping signal on a light panel organized in two dimensions, as for the spatial correlation application. The autocorrelation of a cosine wave is also a cosine wave and when the autocorrelation is folded into the raster pattern of a two dimensional panel, it appears as a spatial wave distribution of light of some orientation and wavelength. A different frequency gives an autocorrelation which appears as a different spatial frequency. Indeed, if the incoming signal to a light panel wired as an autocorrelator is swept in frequency, the light panel appears to sweep through all the possible spatial frequencies, and thus to scan through all spatial frequencies sequentially. If a transparency is placed on the panel, then the scene of the transparency is modulated (multiplied) by the spatial frequency. The total light transmitted through the transparency is then proportional to that spatial frequency content of the transparency's scene. Only a single light detector (photodiode) is required in this application. As the input signal sweeps, the single photodiode output is a scan through all spatial frequency components. If the output is appropriately scanned over a screen, then the true two dimensional spatial frequency spectrum of the scan can be directly displayed. It should be noted that any offset levels can be simply cancelled by subtraction, and that the sine wave spectrum is available by simple additions to the autocorrelator.

These examples of the use of the present invention are not exhaustive.

I claim:

1. A correlator for performing autocorrelation, comprising:
   (a) a linear array of illumination control elements each having a first optical state in which a first light output is provided and a second optical state in which a second light output is provided, each said element changing from its first optical state to its second optical state when a voltage is applied across it, each element being adapted to receive two voltage signals, the optical state of each element at any instant being dependent on the relative values of the voltage signals;
   (b) means for applying a voltage signal from a single signal source to one input of each element in the linear array, said voltage signal from said single signal source representing a signal to be autocorrelated;
   (c) means for applying said signal from said single signal source, after a delay thereof by a respective integral number of time delay periods, to the other input of each element in the linear array; and
   (d) an array of photodiodes, each photodiode receiving light from a respective one of said elements and providing an output signal responsive to said received light, the output signals of said photodiodes representing an autocorrelation of said signal to be correlated.

2. A correlator comprising:
   (a) a rectangular m×n array of illumination control elements each having a first optical state in which a first light output is provided and a second optical state in which a second light output is provided, each said element changing from its first optical state to its second optical state when a voltage is applied across it, each element being adapted to receive two voltage signals representing signals to be correlated, the optical state of each element at any instant being dependent on the relative values of the voltage signals; each element being located at a cross-over point of an m×n matrix formed by a plurality of linear electrical conductors, each conductor being insulated from each other conductor in the matrix; each element having two input terminals, each of which is connected to a respective one of said conductors at the cross-over point where the element is located; m and n being positive integers greater than unity; and (b) a complementary array of photodiodes, each photodiode receiving light from a respective one of said elements, the outputs of said photodiodes representing a correlation of said signals to be correlated.

3. A correlator comprising:

(a) a non-rectangular array of illumination control elements each having a first optical state in which a first light output is provided and a second optical state in which a second light output is provided, each said element changing from its first optical state to its second optical state when a voltage is applied across it, each element being adapted to receive two voltage signals representing signals to be correlated, the optical state of each element at any instant being dependent on the relative values of the voltage signals; each element being located at a cross-over point of a matrix of electrical conductors, each conductor being insulated from each other conductor in the matrix, and each element being connected so that its two input signals are signals on respective ones of the conductors at the cross-over points where the element is located; and (b) a complementary array of photodiodes, each photodiode receiving light from a respective one of said elements, the outputs of said photodiodes representing a correlation of said signals to be correlated.

4. Apparatus as defined in claim 1 claim 2 or claim 3, in which the light output of each illumination control element is focused by optical means on to its associated photodiode.

5. A correlator as defined in claim 1, in which each of said signals is a quantized one-bit voltage signal.

6. A correlator as defined in claim 2 or claim 3, in which said two voltage signals are applied to respective ones of said linear electrical conductors, and wherein the signal applied to each conductor is a respective quantized one-bit voltage signal.

7. An auto-correlator as defined in claim 1 or claim 5, in which said means for applying a common voltage signal to one input of each element comprises a logic inverting gate and means for permitting either the signal or the inverse of said signal to be applied to the elements of the linear array.

8. An auto-correlator as defined in claim 7, further characterised by a switch being positioned between said logic inverting gate and said elements of the linear array, to enable either correlation or anti-correlation to be indicated by the photodiode array.

9. An auto-correlator as defined in claim 7 or claim 8, including, in association with each input to each element, a circuit comprising two conducting lines in parallel, a further logic inverting gate being included in one of said lines in parallel, and a switch to connect one of said lines in parallel to the respective input of an element.

10. A cross-correlator as defined in claim 2, wherein said m×n array includes m rows of conductors each having an input end, and in which the input end of each of said m rows of conductors is connected to the output of a respective first circuit consisting of (a) a first pair of conducting lines, connected in parallel, one end of each line of said first pair being connected to an input of said first circuit, one of said first pair of conducting lines including a logic inverting gate;

(b) a second pair of conducting lines, connected in parallel, one end of each line of said second pair of conducting lines being connected to an output of said first circuit, one of said second pair of conducting lines including a logic inverting gate; and (c) first and second switches being disposed respectively between said first pair of conducting lines and said second pair of conducting lines; said first switch being adapted to select which one of said first pair of conducting lines will be included in the path of an incoming signal; said second switch being adapted to select which one of said second pair of conducting lines will be included in the path of an incoming signal; and the input end of each of said n columns of conductors being connected to the output of a respective second circuit comprising (i) a third pair of conducting lines, connected in parallel, one of said third pair of conducting lines including a logic inverting gate, and (ii) a third switch connecting one of said third pair of conducting lines into the path of an incoming signal; further characterized in that all said first switches are linked to be operated simultaneously, all said second switches are linked to be operated simultaneously, all said third switches are linked to be operated simultaneously, and second switches are linked for simultaneous operation with said third switches.

11. A cross-correlator as defined in claim 10, in which each of said elements consists of a light emitting diode in series with a resistor, said cross-correlator including m+n signal drivers, each said driver being connected between one of said first or second circuits and its respective electrical conductor.

12. A correlator as defined in claim 1, claim 2 or claim 3, including means to read out the array of photodiodes.

13. A correlator as defined in claim 1, claim 2 or claim 3, including an interface between the photodiodes and a computer.

14. A method of correlating a plurality of pairs of quantized electrical signals, comprising the steps of:

(a) applying each pair of quantized signals to the two terminals of a respective element in an array of illumination control elements each having a first optical state in which a first light output is provided and a second optical state in which a second light output is provided, each element having two terminals and changing from its first optical state to its second optical state when a voltage difference is applied across its two terminals;

(b) observing the optical state of each element in the array by focusing the light from each element onto a respective photodiode in an array of photodiodes which is complementary to said array of elements; and (c) reading out the information contained in said complementary array of photodiodes, said information contained in said complementary array of photodiodes representing a correlation of said plurality of pairs of quantized electrical signals.

15. A method as defined in claim 14, in which one of the signals of said pair of signals is a signal from a single source, and the other signal of said pair of signals is the signal from the single source which has been delayed by an integral number of units of time delay ($\tau$), whereby the method is a method of autocorrelation.

16. A method as defined in claim 14, in which the array of elements is an m×n array, and each element is located at the cross-over point of an m×n matrix of conductors with its terminals connected to respective ones of the two conductors at the cross-over point, whereby said monitoring of the optical state of each element (10) is effected to perform cross-correlation of the signals applied to the conductors; where m and n are positive integers.

17. A method as defined in claim 14, claim 15 or claim 16, in which at least one of the signals to be correlated is a many-bit quantized signal, said method being further characterised in that it includes a preliminary step of converting the or each many-bit quantized signal with pulse width modulation of the one-bit quantized signal the width of said pulse width modulation being directly proportional to the instantaneous level, at the time of sampling, of the or the respective many-bit quantized signal.

18. A method as defined in claim 14, in which at least one signal to be correlated is derived from an analogue signal, said method being further characterised in that it includes a preliminary step of converting said or each analogue signal into a one-bit quantized signal with pulse width modulation of the one-bit quantized signal, the width of said pulse width modulation being directly proportional to the instantaneous value, at the time of sampling, of the or the respective analogue signal.

* * * * *